(12) United States Patent
Fertig

(10) Patent No.: US 6,809,003 B1
(45) Date of Patent: Oct. 26, 2004

(54) BI-DIRECTIONAL EPITAXIAL DOPING TECHNIQUE

(75) Inventor: Daniel J. Fertig, Edina, MN (US)

(73) Assignee: Polarfab LLC, Bloomington, MN (US)

( * ) Notice: Subject to any disclaimer, the term of this patent is extended or adjusted under 35 U.S.C. 154(b) by 89 days.

(21) Appl. No.: 10/405,718

(22) Filed: Apr. 2, 2003

(51) Int. Cl.$^7$ .......................... H01L 21/76; H01L 27/00
(52) U.S. Cl. ..................... 438/416; 438/481; 438/517; 257/929
(58) Field of Search ................... 438/542–554, 438/226, 269, 341, 41, 44, 222, 245, 357–363, 388, 413–517; 257/592, 929

(56) References Cited

U.S. PATENT DOCUMENTS 5,355,831 A * 10/1994 Schauer ........................ 117/89
6,365,447 B1 * 4/2002 Hebert et al. ................ 438/203
6,589,336 B1 * 7/2003 Ebara et al. .................. 117/94

* cited by examiner

Primary Examiner—Matthew Smith
Assistant Examiner—Calvin Lee
(74) Attorney, Agent, or Firm—Kinney & Lange, P.A.

(57) ABSTRACT

A method of forming a semiconductor device on a substrate. The method includes forming a first epitaxial layer on the substrate. Next, a selected impurity is introduced to a surface of the first epitaxial layer. A second epitaxial layer is then formed on the surface of the first epitaxial layer and over the selected impurity. Finally, the selected impurity is driven through the first epitaxial layer and the second epitaxial layer to form the desired doped regions.

10 Claims, 8 Drawing Sheets

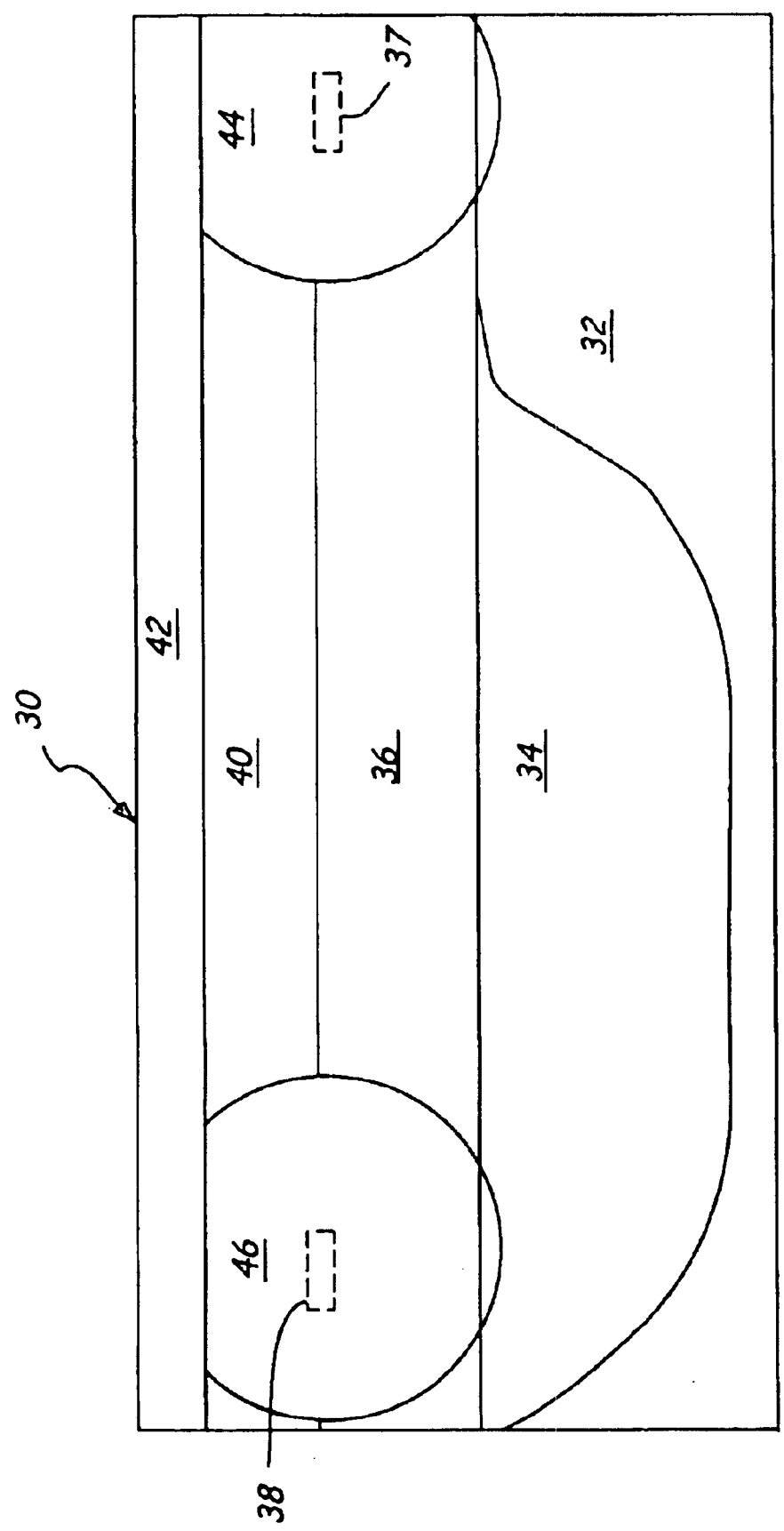

BI-DIRECTIONAL EPITAXIAL DOPING TECHNIQUE

BACKGROUND OF THE INVENTION

The present invention relates to an improved method of forming a semiconductor device, and more particularly an improved method of forming doped regions through an epitaxial layer of a semiconductor device.

In semiconductor fabrication, it is often desirable to form doped regions which extend through an epitaxial layer, such as vertical channels or isolation regions. One common method of forming these doped regions is by using top-down diffusion. Top-down diffusion is a process which begins with the deposition of a full epitaxial layer on a surface of a substrate. After the full epitaxial layer has been deposited, a dopant is introduced to a selected location on top of the epitaxial layer. The wafer is then placed into a furnace, which causes the dopants to be driven down into the epitaxial layer. If the wafer is kept in the furnace for a sufficient time, the dopant will work its way through the entire epitaxial layer, forming the desired doped region.

There are three primary problems with the top-down diffusion process. First, in semiconductor fabrication it is often desirable for an oxide to be formed on top of the dopant and the epitaxial layer before placing the wafer into the furnace, because the oxide will protect the wafer and act as a diffusion barrier. The oxide may also be grown during the diffusion of the dopant. Unfortunately, in the case of boron dopant the oxide has the undesirable property that it will absorb a large percentage of certain dopants, rather than allowing all of the dopant to diffuse through the epitaxial layer. Therefore, when the oxide layer is formed immediately adjacent to the dopant, a large amount of dopant must originally be introduced to ensure that a sufficiently doped region is formed through the epitaxial layer. The second problem with this method is that the dopant must be diffused through the entire epitaxial layer. Since the diffusion time increases as the square of diffusion distance, the fabrication time could be decreased significantly if the diffusion distance were reduced. The third problem with this method is that the dopant diffuses both vertically and laterally and therefore creates a lateral diffusion region that is related to the thickness of the epitaxial layer. It is desirable to keep the diffusion region as small as possible in the lateral dimension to reduce device sizes. If smaller devices can be fabricated, chip sizes are reduced, which results in a greater number of chips that can be fabricated on a single wafer.

To solve some of these problems, another prior art method, top-down/bottom-up diffusion, has been used to create a doped region through an epitaxial layer. Top-down/bottom-up diffusion is similar to top-down diffusion, except that the dopant is introduced both before and after the deposition of the epitaxial layer. Temperature elevation then causes the dopants to diffuse both up and down through the epitaxial layer and meet in the middle. While this method does reduce the lateral dimensions of the doped region and decreases the time needed for the diffusion process, additional masking steps are necessary to form the additional doped areas. Since the time to form a single masking layer can be as much as one day, the time needed to form and remove the additional masking layers counteracts the benefits of the decreased diffusion time.

BRIEF SUMMARY OF THE INVENTION

The present invention is an improved method of forming doped regions through an epitaxial layer during semiconductor fabrication. The method involves introducing dopants in the middle of the epitaxial layer and diffusing them bi-directionally to form the desired features. This is accomplished by depositing a first epitaxial half-layer on top of a substrate. Next, a dopant (or multiple dopants) is introduced on top of the first epitaxial half-layer. A second epitaxial half-layer is then deposited over the first epitaxial half-layer. The first and second epitaxial half-layers together form a full epitaxial layer of the desired thickness. After any other desired layers have been formed over the second epitaxial half-layer the wafer is heated to diffuse the dopants through the epitaxial half-layers. This method results in reduced total fabrication time, minimal lateral diffusion and a reduced amount of necessary dopants. The reduced total fabrication time also helps to minimize the rise of the buried layer.

BRIEF DESCRIPTION OF THE DRAWINGS

FIG. 9 is a layer diagram of a semiconductor device after the deposition of an oxide layer and the diffusion of the dopants through the epitaxial layer.

DETAILED DESCRIPTION

Figure 1:
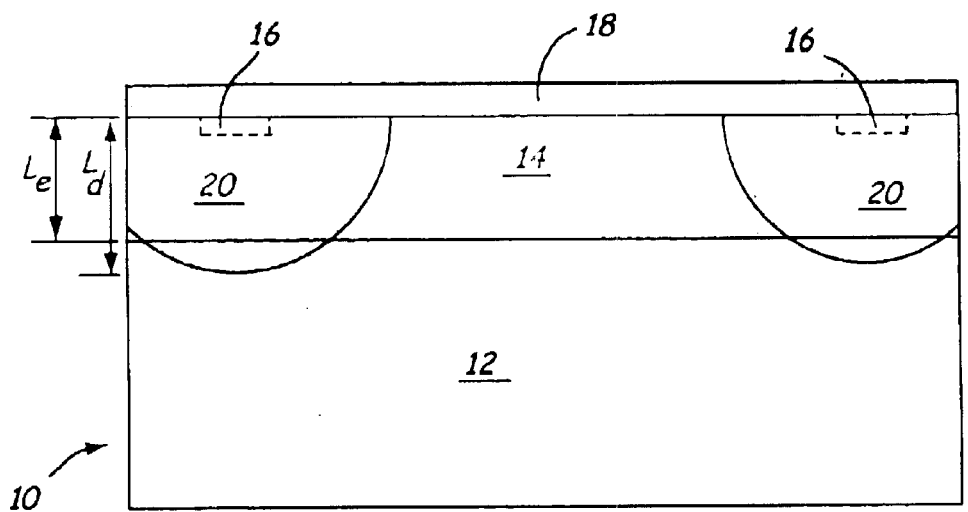
FIG. 1 is a layer diagram illustrating the prior art method of top-down diffusion used to form a semiconductor device.

FIG. 1 is a layer diagram illustrating the prior art method of top-down diffusion used to form semiconductor device 10. Device 10 includes substrate 12, epitaxial layer 14, dopants 16, oxide layer 18, and doped regions 20. The process begins with substrate 12, which is typically a silicon wafer. Next, epitaxial layer 14 is deposited on top of substrate 12. Dopants 16 are then introduced onto selected surface locations on epitaxial layer 14. The area into which the dopants are introduced can be selected either by etching a previously grown oxide or by a photoresist mask. Oxide layer 18 is deposited on top of epitaxial layer 14 and dopants 16. Once all desired layers have been deposited, device 10 is heated to allow dopants 16 to diffuse through epitaxial layer 14. Device 10 is kept at an elevated temperature until dopants 16 have diffused completely through epitaxial layer 14 to form doped regions 20.

There are a number of problems with this method. The first problem is that the process of diffusing dopants 16 through epitaxial layer 14 takes a relatively long time. As shown in FIG. 1, the distance that dopants 16 must diffuse ($L_d$) is equal to or greater than the thickness of epitaxial layer 14 ($L_e$). The amount of time needed for dopants 16 to diffuse through epitaxial layer 14 is typically on the order of 12 to 16 hours.

A second problem with the method of FIG. 1 is the large lateral diffusion. While dopants 16 are diffusing down through epitaxial layer 14, dopants 16 also spread laterally. This large lateral diffusion adversely impacts the packing density of circuits fabricated in this manner.

A third problem with this method is that a large amount of a dopant 16, such as boron, is needed when oxide layer 18 is formed on top of dopants 16. While oxide layer 18 provides the benefit of a diffusion barrier and helps to protect the wafer, a large percentage of certain types of dopants 16 will segregate into oxide layer 18, rather than diffusing through epitaxial layer 14. Therefore, when dopants 16 are introduced immediately adjacent to oxide layer 18, large amounts of dopants 16 must be initially introduced to ensure that the necessary amounts of dopants 16 diffuse through epitaxial layer 14.

Figure 2:
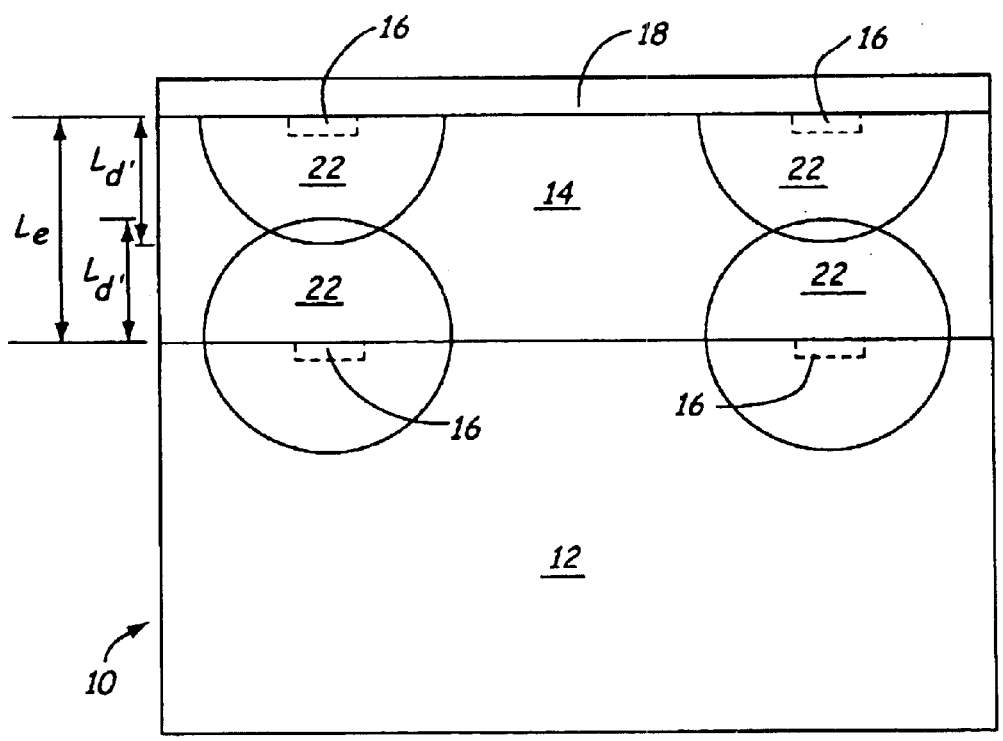
FIG. 2 is a layer diagram illustrating the prior art method of top-down/bottom-up diffusion used to form a semiconductor device.

FIG. 2 is a layer diagram illustrating the prior art method of top-down/bottom-up diffusion used to form semiconductor device 10. The top-down/bottom-up diffusion method solves some of the problems that exist in the top-down diffusion method. Device 10 includes substrate 12, epitaxial layer 14, dopants 16, and oxide layer 18. The most significant difference between this method and the top-down diffusion method of FIG. 1 is that dopants 16 are introduced both prior to and subsequent to the deposition of epitaxial layer 14. After all desired layers have been formed and all desired dopants have been introduced, device 10 is heated to allow dopants 16 to diffuse through epitaxial layer 14. However, in this method dopants 16 only need to diffuse halfway through epitaxial layer 14, to form doped regions 22.

Since dopants 16 were introduced both above and below epitaxial layer 14, dopants 16 diffuse toward each other until they meet in the center of epitaxial layer 14. The distance that dopants 16 must diffuse through epitaxial layer 14 ($L_d'$) is approximately equal to one half the thickness of epitaxial layer 14 ($L_e$). Therefore, the time needed to diffuse dopants 16 through epitaxial layer 14 is also reduced. While this method does reduce the diffusion times, the extra processing steps needed to introduce the additional dopants counteract these benefits. For example, to introduce a single dopant at both locations 16 (shown in FIG. 1), a single masking layer is necessary. If a different dopant is introduced at each of the two locations 16 (shown in FIG. 1), two masking layers are necessary. In the method shown in FIG. 2, dopants are introduced at four locations. If a single dopant is used, the number of masking layers required is two. If different dopants are used, the number of masking layers required is four. In any case, the number of masking layers needed is doubled for the top-down/bottom-up diffusion method. Since a single masking layer can take as long as one day to form, the additional masking layers could add two days to the time needed to fabricate these devices, thereby counteracting the benefits gained by the shortened diffusion time.

The method of the present invention solves the problems of the prior art by reducing total fabrication time, minimizing lateral diffusion, and reducing the amount of dopant that needs to be introduced. For exemplary purposes, the method of the present invention is described with reference to the formation of an NPN transistor. It is recognized that the method could be applied to any semiconductor device in which a dopant needs to be driven through an epitaxial layer. In addition to this, various masking and mask removal steps are used in the formation of a semiconductor device according to the present invention. These steps are known to one skilled in the art, and therefore have been excluded from the figures and description to aid in the understanding of the novel features of the present invention.

Figure 3:
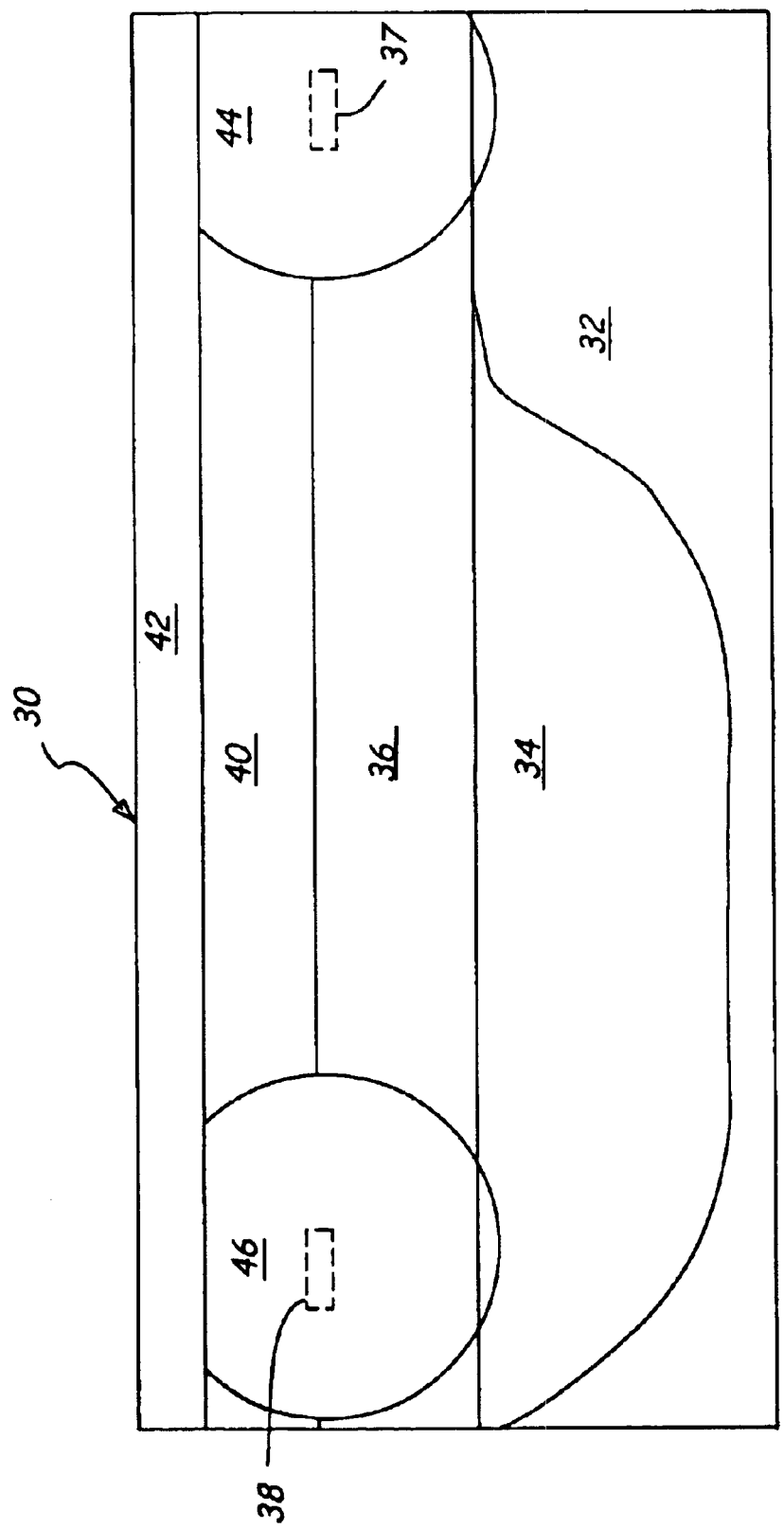
FIG. 3 is a layer diagram of a semiconductor device formed according to the method of the present invention.

FIG. 3 is a layer diagram of semiconductor device 30 formed according to the method of the present invention. Device 30 includes substrate 32, optional buried layer 34, first epitaxial half-layer 36, first dopant 37 and second dopant 38, second epitaxial half-layer 40, oxide layer 42, doped channel stop region 44 and doped n-sinker region 46.

As shown in FIG. 3, the method of the present invention splits the epitaxial layer into two parts consisting of first epitaxial half-layer 36 and second epitaxial half-layer 40. During the formation of device 30, first dopant 37 and second dopant 38 are introduced between first epitaxial half-layer 36 and second epitaxial half-layer 40. After all layers are deposited as shown in FIG. 3, the temperature of device 30 is elevated to allow first dopant 37 and second dopant 38 to diffuse throughout the epitaxial layer to form the desired diffusion regions, for example, doped channel stop region 44 and doped n-sinker region 46.

Figure 4:
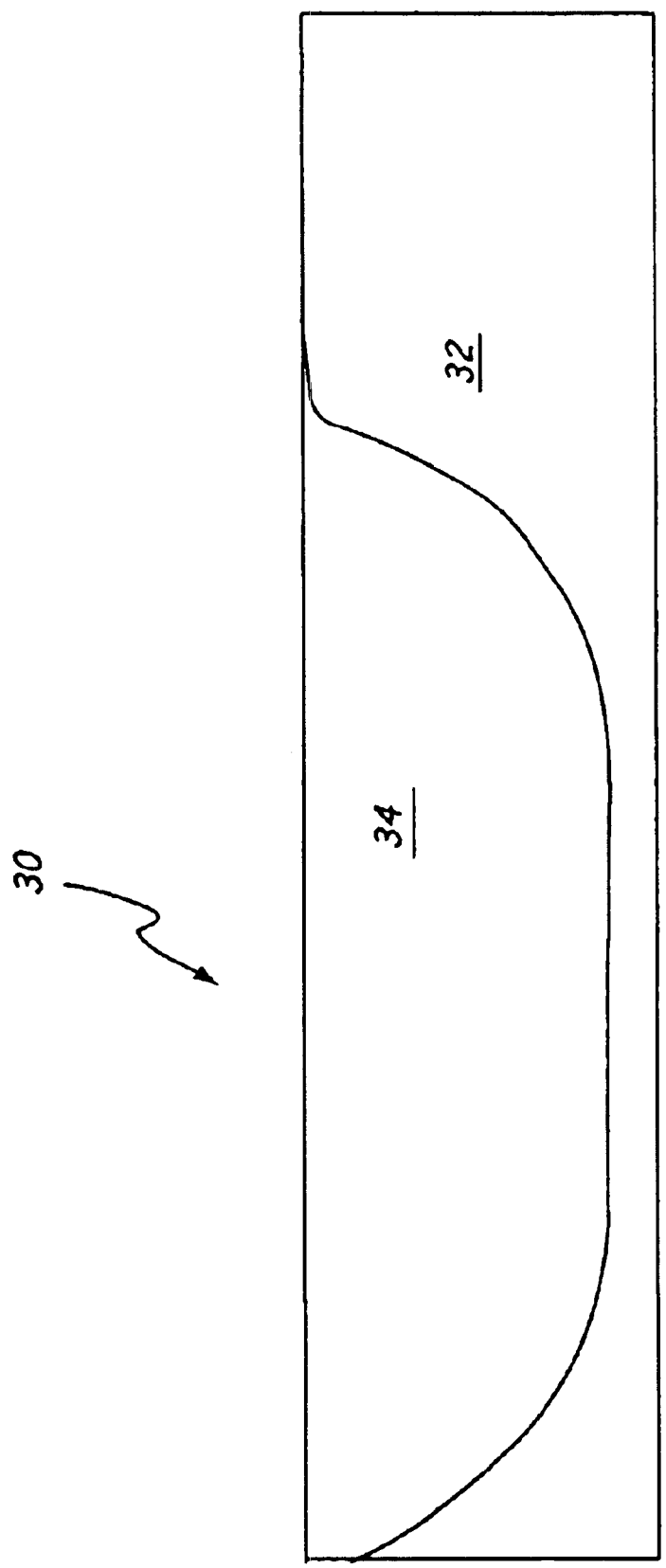
FIG. 4 is a layer diagram of a silicon wafer after an optional buried layer diffusion.

The method of forming device 30 will now be described with reference to FIGS. 4–9, which illustrate stages of the fabrication process. FIG. 4 is a layer diagram of a semiconductor wafer after an optional buried layer diffusion. At this stage, device 30 includes substrate 32, and buried layer 34. Substrate 32 is a portion of a semiconductor wafer, typically made of silicon, onto which subsequent layers are deposited to form the desired semiconductor device. Substrate 32 is typically lightly doped with either p-type or n-type impurities, depending on the type of device to be formed. A lightly doped p-type substrate 32 is shown in FIG. 4. Substrate 32 can also include various features such as optional buried layer 34, which is formed in a manner known in the art.

Figure 5:
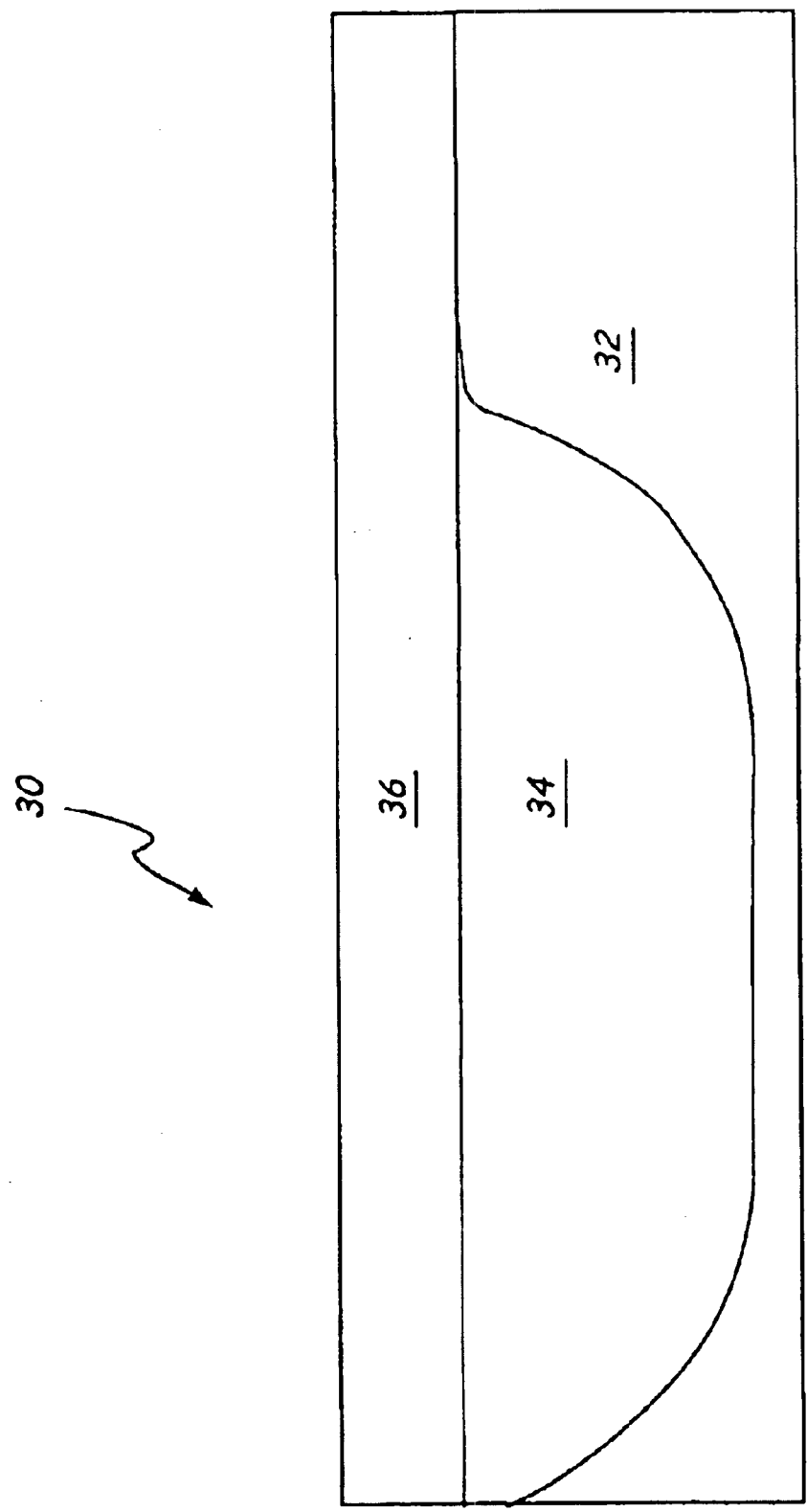
FIG. 5 is a layer diagram of a semiconductor device after deposition of a first epitaxial half-layer.

FIG. 5 is a layer diagram of semiconductor device 30 after deposition of first epitaxial half-layer 36. At this stage, device 30 includes substrate 32, optional buried layer 34, and first epitaxial half-layer 36. First epitaxial half-layer 36 is deposited, through a process such as chemical vapor deposition, on the surface of substrate 32 and optional buried layer 34. The thickness of first epitaxial half-layer 36 is preferably about half of the desired thickness of the full epitaxial layer. However, the actual thickness may be varied somewhat based on other process specific details which may depend on the application. In this example, first epitaxial half-layer 36 is lightly doped with an n-type dopant.

Figure 6:
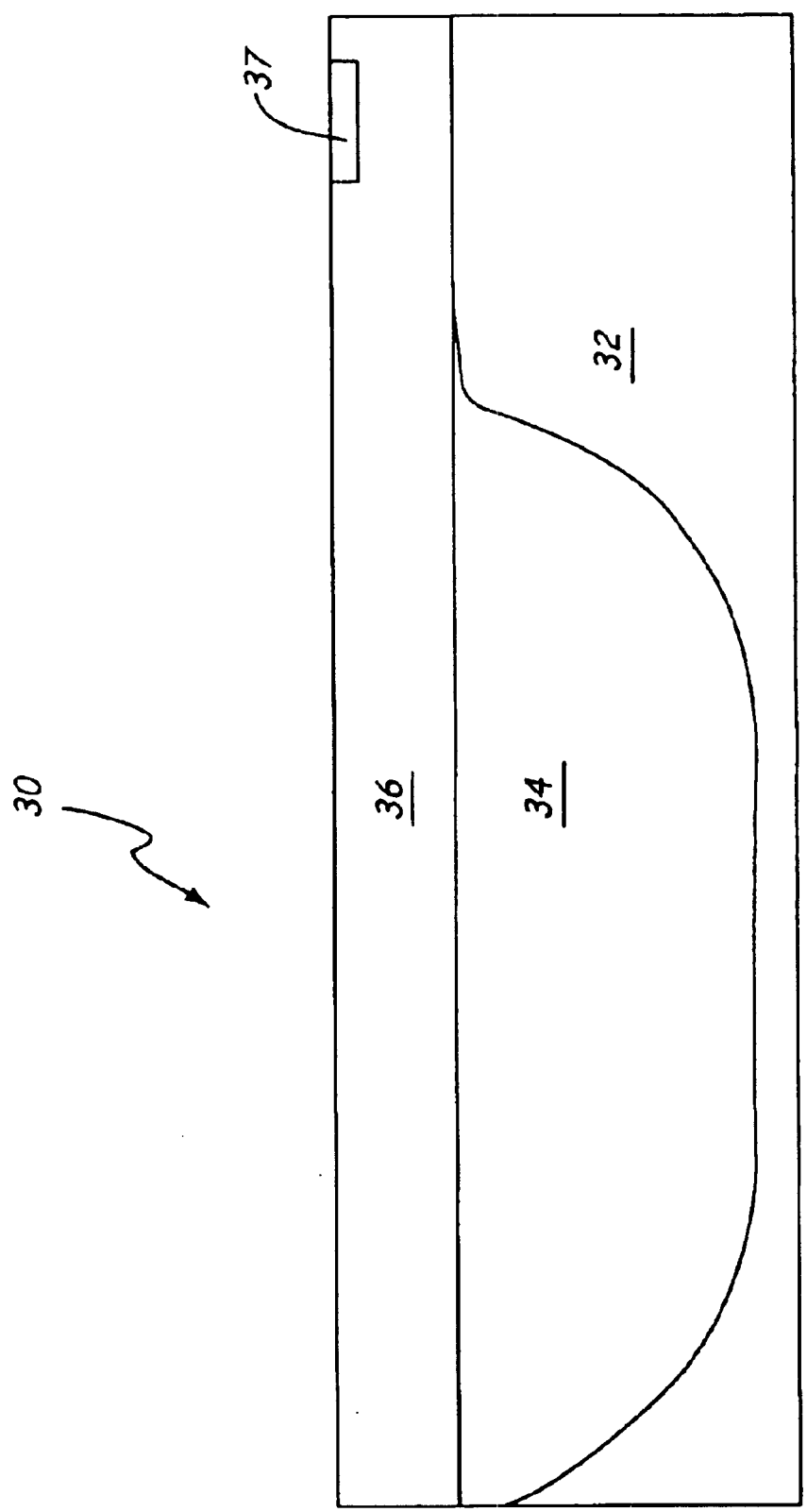
FIG. 6 is a layer diagram of a semiconductor device after the introduction of a first dopant.

FIG. 6 is a layer diagram of a semiconductor device after the introduction of first dopant 37. At this stage, device 30 includes substrate 32, optional buried layer 34, first epitaxial half-layer 36, and first dopant 37. First dopant 37 is introduced to a selected location, or to multiple locations, on the surface of first epitaxial half-layer 36 through a process such as ion implantation. Prior to the introduction of dopant 37, a mask must be formed to define the selected location for dopant 37 to be introduced. The mask can be formed by well known processes such as photolithography. Dopant 37 can be any desired impurity of n-type or p-type such as boron, phosphorus, arsenic, antimony, aluminum, or others. In this example, dopant 37 is a p-type boron impurity.

Figure 7:
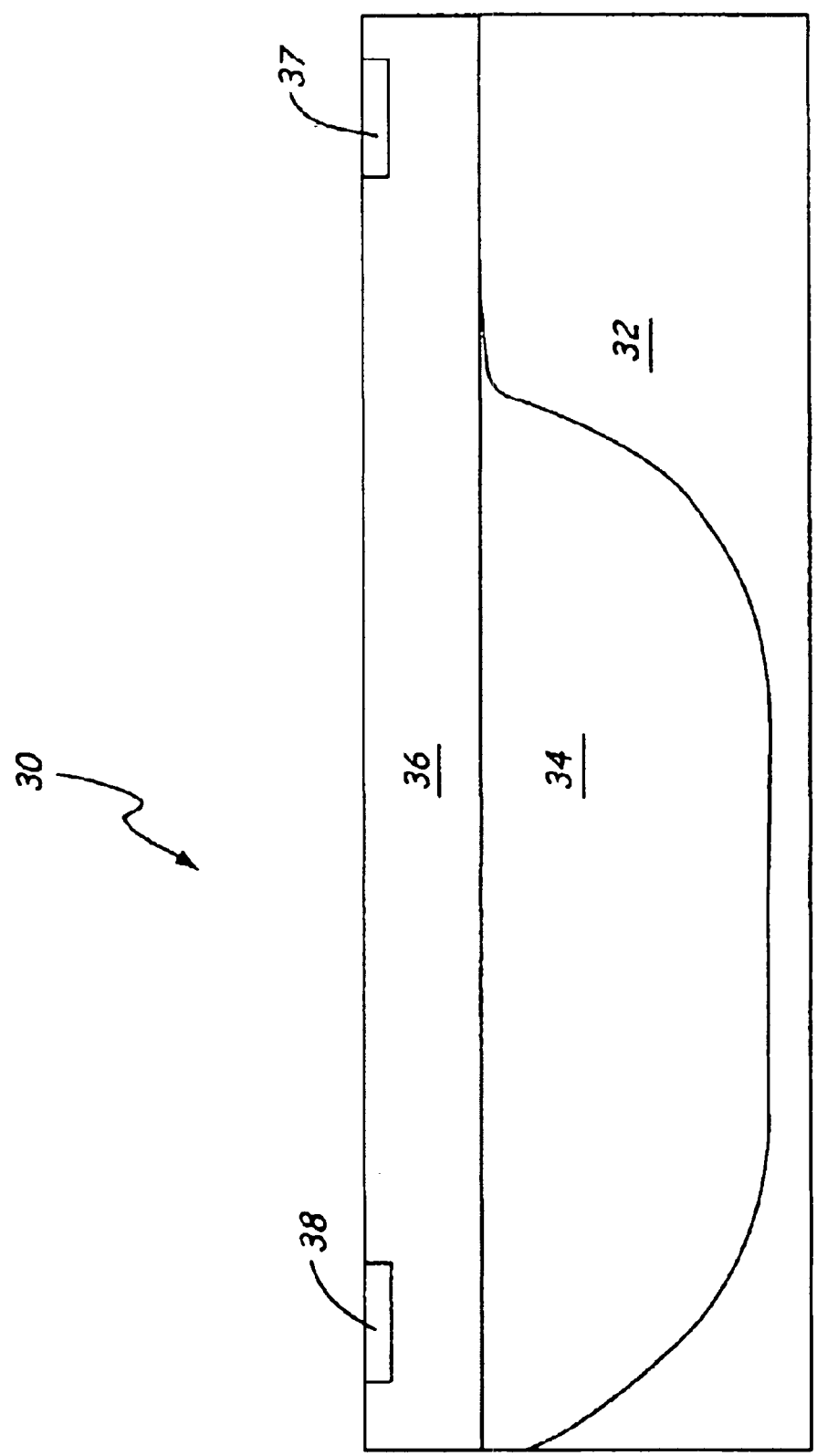
FIG. 7 is a layer diagram of a semiconductor device after the introduction of a second dopant.

FIG. 7 is a layer diagram of a semiconductor device after the introduction of second dopant 38. At this stage, device 30 includes substrate 32, optional buried layer 34, first epitaxial half-layer 36, first dopant 37, and second dopant 38. Second dopant 38 is introduced to a selected location, or to multiple locations, on the surface of first epitaxial half-layer 37 through a process such as ion implantation. As in the introduction of first dopant 37, a mask must be formed prior to the introduction of second dopant 38. Second dopant 38 is typically of a different type than first dopant 37, but can be any desired impurity of n-type or p-type such as boron, phosphorus, arsenic, antimony, aluminum, or others. In this example, dopant 38 is an n-type impurity such as phosphorus or arsenic. While two dopants are shown in this example, it is understood that more or fewer could be used as desired for the type of device being fabricated.

Figure 8:
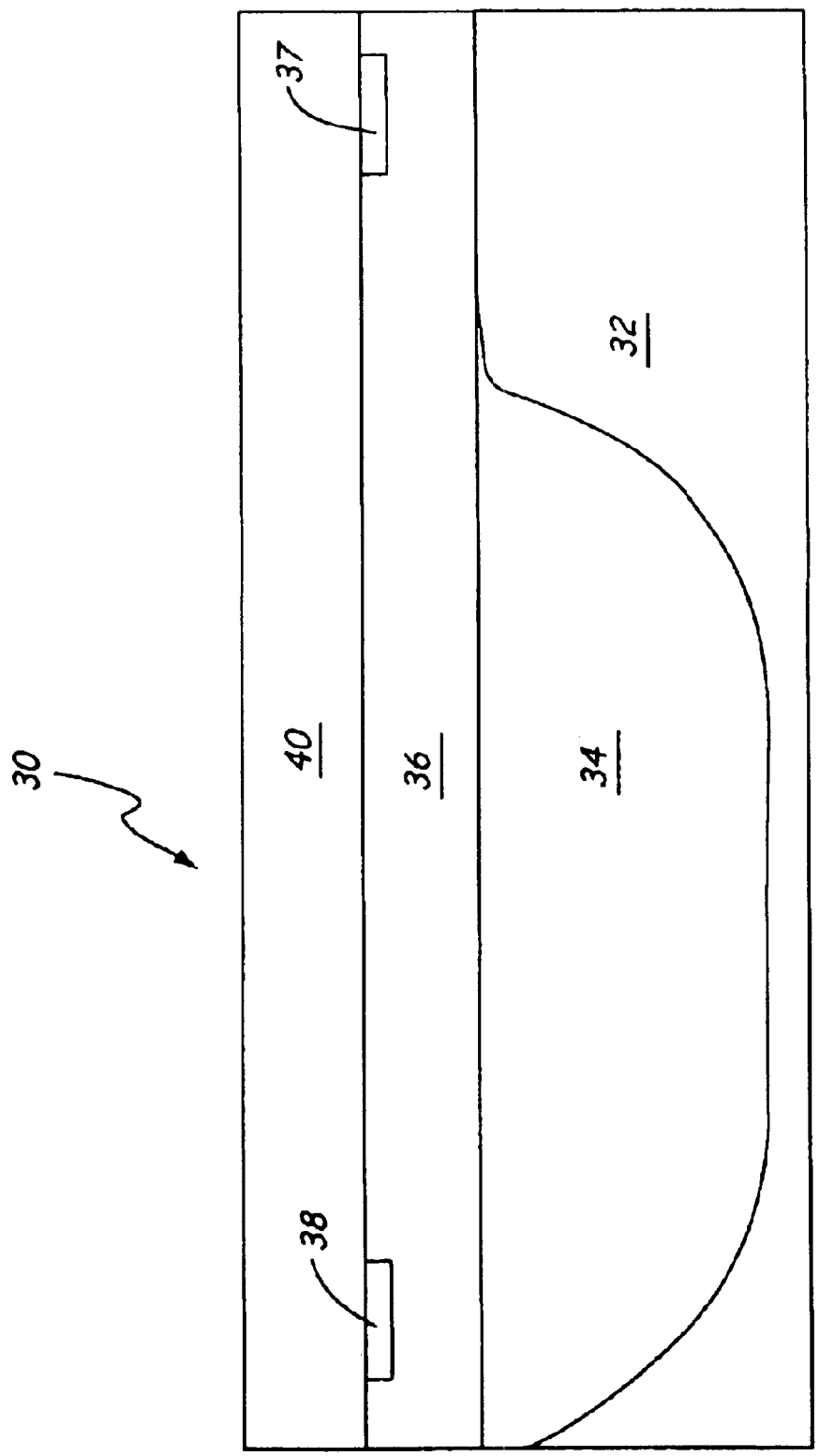
FIG. 8 is a layer diagram of a semiconductor device after the deposition of a second epitaxial half-layer.

FIG. 8 is a layer diagram of a semiconductor device after the deposition of second epitaxial half-layer 40. At this stage, device 30 includes substrate 32, optional buried layer 34, first epitaxial half-layer 36, first dopant 37, second dopant 38, and second epitaxial half-layer 40. After the introduction of first dopant 37 and second dopant 38, second epitaxial half-layer 40 is deposited, through a process such as chemical vapor deposition, on the surface of first epitaxial half-layer 36, first dopant 37 and second dopant 38. The thickness of second epitaxial half-layer 40 is such that the combination of first epitaxial half-layer 36 and second epitaxial half-layer 40 form a single epitaxial layer of the desired thickness. Typically, second epitaxial half-layer 40 would be about the same thickness as first epitaxial half-layer 36. In alternative embodiments, the thickness of first epitaxial half-layer 36 or second epitaxial half-layer 40 may be thicker than the thickness of the other epitaxial half-layer.

FIG. 9 is a layer diagram of a semiconductor device after the growth or deposition of oxide layer 42 and the diffusion of first dopant 37 and second dopant 38 through the epitaxial layer. Device 30 includes substrate 32, optional buried layer 34, first epitaxial layer 36, first dopant 37, second dopant 38, second epitaxial half-layer 40, oxide 42, doped channel stop region 44, and doped n-sinker region 46. After second epitaxial half-layer 40 has been deposited, oxide layer 42 is formed on top of second epitaxial half-layer 40, if desired. Then, with all layer formation and dopant introductions completed, device 30 is heated in a furnace to allow first dopant 37 and second dopant 38 to diffuse bi-directionally (up and down) through the epitaxial layer. Since dopants 37 and 38 were introduced between first epitaxial half-layer 36 and second epitaxial half-layer 40, some of dopants 37 and 38 will be driven through first epitaxial half-layer 36, and the rest will be driven through second epitaxial half-layer 40. The resulting diffusion areas form the desired features, for example doped channel stop region 44 and doped n-sinker region 46.

The length of time needed to diffuse dopants through the epitaxial layer is proportional to the square of the distance. As a practical example, it has been found that it takes roughly three to four hours for the dopants to diffuse through the halves of the epitaxial layer. On the other hand, it takes roughly 12 to 16 hours for dopants to diffuse through the entire epitaxial layer. For this reason, the present invention implants dopants 37 and 38 in the middle of the epitaxial layer (between first epitaxial half-layer 16 and second epitaxial half-layer 22), and then drives them bi-directionally through the epitaxial layer such that the total distance traveled by dopants 37 and 38 is approximately equal to one half of the thickness of the epitaxial layer. This results in significant time savings (roughly eight to twelve hours) over the prior art method of top-down diffusion.

The reduced diffusion time also results in at least two additional benefits. First, reduced diffusion time results in less lateral diffusion. This results in smaller chip sizes and allows more devices to be manufactured on a single wafer. Second, the shorter diffusion time reduces the up-diffusion of optional buried layer 34 into the epitaxial layer. This is beneficial because electrical malfunctions can develop if optional buried layer 34 diffuses too high into the epitaxial layer.

As an additional benefit, the method of the present invention minimizes the number of masking and mask removal steps needed to form doped regions through an epitaxial layer. Since masking steps can take as long as a day to perform, a reduction in masking steps results in less time needed to manufacture a device. In comparison to the top-down/bottom-up method (as previously described in reference to FIG. 2), the method of the present invention would only require two masking layers, rather than four, which could mean a savings of up to two days.

As a further benefit, the method of the present invention does not require the large amounts of dopant that are required by the prior art. Since dopants 37 and 38 are not introduced immediately adjacent to oxide layer 42, the only dopants that segregate into oxide layer 42 are those that have already diffused through second epitaxial half-layer 40. At that point, the desired diffusion has already been completed, and the device can be removed from the furnace to stop any subsequent diffusion. Therefore, the amount of dopant 37 or 38 that goes into oxide layer 42 is minimal.

Although the present invention has been described with reference to preferred embodiments, workers skilled in the art will recognize that changes may be made in form and detail without departing from the spirit and scope of the invention.

What is claimed is:

1. A method of forming a semiconductor device, the method comprising:

forming a first epitaxial layer on a surface of a substrate;

introducing a dopant to a surface of the first epitaxial layer;

forming a second epitaxial layer over the surface of the first epitaxial layer and over the dopant;

forming an oxide layer on a surface of the second epitaxial layer; and driving the dopant through the first epitaxial layer and the second epitaxial layer to form a continuous doped region between the oxide layer and the substrate.

2. The method of claim 1, wherein the substrate includes a buried layer.

3. The method of claim 1, wherein the dopant is introduced to the first epitaxial layer by ion implantation.

4. The method of claim 1, wherein the dopant is driven into the first epitaxial layer and the second epitaxial layer by heating the semiconductor device in a furnace.

5. The method of claim 1, wherein a thickness of the first epitaxial layer is greater than a thickness of the second epitaxial layer, and wherein the dopant is driven a distance substantially equal to the thickness of the first epitaxial layer.

6. The method of claim 1, wherein a thickness of the second epitaxial layer is greater than a thickness of the first epitaxial layer, and wherein the dopant is driven a distance substantially equal to the thickness of the second epitaxial layer.

7. The method of claim 1, wherein a thickness of the first epitaxial layer is substantially equal to a thickness of the second epitaxial layer.

8. The method of claim 1, wherein the dopant is any impurity selected from the group consisting of boron, phosphorus, arsenic, antimony, and aluminum.

9. The method of claim 1, wherein the first epitaxial layer and the second epitaxial layer are formed by chemical vapor deposition.

10. A semiconductor device fabricated by the process of claim 1.

* * * * *